United States Patent
Lei et al.

(10) Patent No.: US 9,681,583 B2
(45) Date of Patent: Jun. 13, 2017

(54) FIXATION OF HEAT SINK ON SFP/XFP CAGE

(71) Applicant: TELLABS OPERATIONS, INC., Naperville, IL (US)

(72) Inventors: Zhen Lei, Shanghai (CN); Qinzhen Ba, Shanghai (CN); Zongxian Duan, Shanghai (CN); Huihui Yu, Shanghai (CN)

(73) Assignee: Coriant Operations Inc., Naperville, IL (US)

( * ) Notice: Subject to any disclaimer, the term of this patent is extended or adjusted under 35 U.S.C. 154(b) by 67 days.

(21) Appl. No.: 14/387,451

(22) PCT Filed: Sep. 23, 2013

(86) PCT No.: PCT/CN2013/083974
§ 371 (c)(1),
(2) Date: Sep. 23, 2014

(87) PCT Pub. No.: WO2015/039341
PCT Pub. Date: Mar. 26, 2015

(65) Prior Publication Data
US 2016/0021787 A1   Jan. 21, 2016

(51) Int. Cl.
*H05K 7/20* (2006.01)
*H01L 23/40* (2006.01)
(Continued)

(52) U.S. Cl.
CPC ......... *H05K 7/20409* (2013.01); *B23P 15/26* (2013.01); *H01L 23/4093* (2013.01);
(Continued)

(58) Field of Classification Search
None
See application file for complete search history.

(56) References Cited

U.S. PATENT DOCUMENTS 6,518,507 B1 *  2/2003 Chen ............... H01L 23/4093
                                                  165/80.3
6,916,123 B2    7/2005 Kruger et al. ............... 385/92
(Continued)

FOREIGN PATENT DOCUMENTS

| CN | 101094582 A | 12/2007 |
| CN | 101488610 A | 7/2009 |
| CN | 102427175 A | 4/2012 |

OTHER PUBLICATIONS

International Search Report and Written Opinion of the International Search Authority from International Application No. PCT/CN2013/083974, dated Jun. 23, 2014 (11 pages).

*Primary Examiner* — Courtney Smith
(74) *Attorney, Agent, or Firm* — Merchant & Gould, P.C.

(57) ABSTRACT

An apparatus and system for a heat sink assembly, and a procedure for forming a heat sink assembly. The heat sink assembly includes a heat sink having a base and fins extending from the base, and a spring clip disposed on the heat sink between the fins. The spring clip includes a first tab that forms a first angle with respect to the base of the heat sink and including a second tab that forms a second angle with respect to the base of the heat sink. The first and second tabs are attached to the circuit board. By virtue thereof, a heat sink attachment to cage is provided that is space-efficient and permits a higher density of cages on a circuit board than do conventional arrangements.

18 Claims, 6 Drawing Sheets

(51) Int. Cl.
*B23P 15/26* (2006.01)
*H05K 1/02* (2006.01)
*H01L 23/367* (2006.01)

(52) U.S. Cl.
CPC ........ *H05K 1/0203* (2013.01); *H01L 23/3677* (2013.01); *H01L 2924/0002* (2013.01); *H05K 2201/06* (2013.01)

(56) References Cited

U.S. PATENT DOCUMENTS

| | | | | |
|---|---|---|---|---|
| 6,986,679 | B1 | 1/2006 | Aronson et al. | 439/374 |
| 7,405,931 | B2 * | 7/2008 | Saturley | G06F 1/20 |
| | | | | 361/679.48 |
| 7,529,094 | B2 * | 5/2009 | Miller | G02B 6/4246 |
| | | | | 165/185 |
| 7,539,018 | B2 | 5/2009 | Murr et al. | 361/704 |
| 8,599,559 | B1 * | 12/2013 | Morrison | H05K 7/20418 |
| | | | | 361/702 |
| 8,885,342 | B2 * | 11/2014 | Skepnek | H01L 23/367 |
| | | | | 174/548 |
| 2003/0161108 | A1 * | 8/2003 | Bright | G02B 6/4201 |
| | | | | 361/707 |
| 2004/0027816 | A1 * | 2/2004 | Ice | G02B 6/4201 |
| | | | | 361/797 |
| 2005/0195565 | A1 * | 9/2005 | Bright | H05K 7/20418 |
| | | | | 361/688 |
| 2008/0137306 | A1 | 6/2008 | Kim | 361/709 |

\* cited by examiner

FIXATION OF HEAT SINK ON SFP/XFP CAGE

FIELD OF THE INVENTION

Example embodiments described herein relate generally fixation of heat sinks to circuit boards and, more specifically, fixation of a heat sink to a SFP/XFP cage mounted on a circuit board.

DESCRIPTION OF RELATED ART

The small form-factor pluggable (SFP) is a standard for compact, hot-pluggable transceivers used for both telecommunication and data communications applications. The ten gigabit small form-factor pluggable (XFP) is a standard for transceivers for high-speed computer network and telecommunication links that use optical fiber. SFP and XFP transceivers are typically inserted into circuit board-mounted receptacles, termed "cages" to retain the SFP and XFP transceivers for connection to components on a circuit board. A transceiver typically generates heat when it is powered and retained in a cage. The SFP and XFP cages are typically constructed of metal and are typically designed to be bezel-mounted to a circuit board, (e.g., an I/O panel) with compliant pins for pressing onto the circuit board.

Heat sinks are typically used to dissipate heat generated by a transceiver retained in a cage. For each transceiver, the heat generated is transmitted through a corresponding cage and a heat sink in contact with the metal cage. Typically, the heat sink is retained in contact with the cage using a spring clip that presses the heat sink in contact with the cage.

Figure 1:
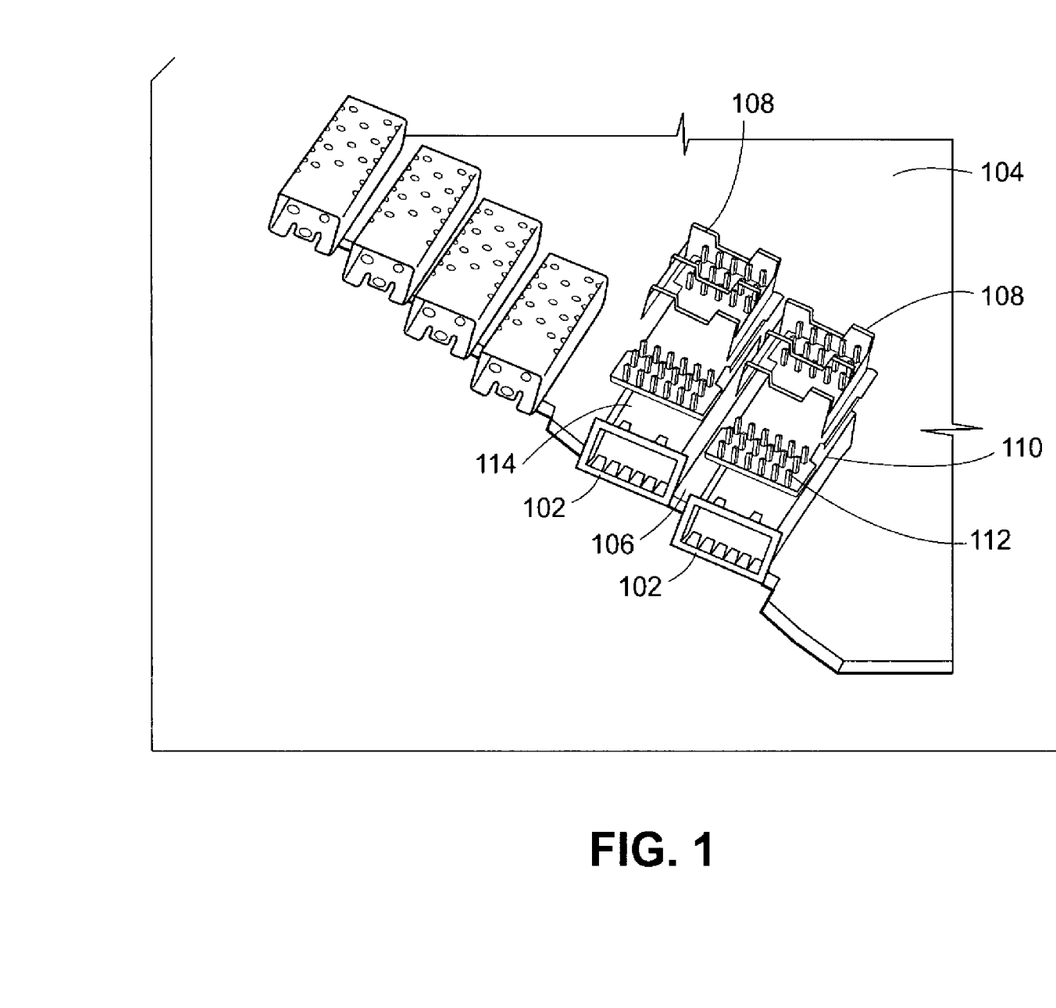
FIG. 1 shows an isometric view showing an upper part and a side of a circuit board.

An example of a typical arrangement of a heat sink attached to a cage is shown in FIG. 1, which is an isometric view showing an upper part and a side of a circuit board 104. In FIG. 1, a plurality of cages 102 are spaced from each other across the front of the circuit board 104. Gaps 106 between adjacent cages 102 provide space for spring clips 108 to mount to the sides of the cages 102. Specifically, along the top edges 110 of the cages 102 are a plurality of holes that receive the spring clips 108 that are each bent to apply a compressive force to press a respective heat sink 112 into contact with a corresponding upper surface 114 of one of the cages 102.

The arrangement shown in FIG. 1 however requires that each spring clip 108 and/or heat sink 112 extend into the gap 106 between adjacent cages 102. In order to maximize the density of cages 102 on the board 104, the dimensions of the gap 106 would have to be made smaller. However, if the gap 106 is made too small, there will not be sufficient space available to dispose the spring clips 108 in the gap 106.

SUMMARY

The above and other limitations are overcome by an apparatus and a system for a heat sink assembly, and by a procedure for forming a heat sink assembly.

In accordance with one example embodiment herein, the heat sink assembly includes a heat sink having a base and fins extending from the base, and a spring clip disposed on the heat sink between the fins. The spring clip includes a first tab that forms a first angle with respect to the base of the heat sink and includes a second tab that forms a second angle with respect to the base of the heat sink.

In accordance with another example embodiment herein, the system includes a circuit board having one or more cages mounted thereto, where each cage has an upper surface formed with an opening therethrough, and a heat sink assembly mountable on at least a respective one of the cages. The heat sink assembly includes a heat sink having a base and fins extending from the base, and a spring clip disposed on the heat sink between the fins. The spring clip includes a first tab that forms a first angle with respect to the base of the heat sink and includes a second tab that forms a second angle with respect to the base of the heat sink.

In accordance with another example embodiment herein, the procedure includes placing the heat sink assembly on a cage of a circuit board and securing the first and second tabs to the circuit board.

The example embodiments described herein provide for a heat sink attachment to cage such as a transceiver cage (e.g., an SFP/XFP cage) that is space-efficient so that extra spaces need not be provided on a circuit board between adjacent cages for attachment of a heat sink to the cages. Accordingly, the example embodiments described herein permit a higher density of cages on a circuit board than do conventional arrangements.

Additional features and benefits of the exemplary embodiments will become apparent from the detailed description, figures and claims set forth below.

DESCRIPTION OF DRAWINGS

The teachings claimed and/or described herein are further described in terms of exemplary embodiments. These exemplary embodiments are described in detail with reference to the drawings. These embodiments are non-limiting exemplary embodiments, wherein:

DETAILED DESCRIPTION

Those of ordinary skill in the art will realize in view of this description that the following detailed description of the exemplary embodiments is illustrative only and is not intended to be in any way limiting. Other embodiments will readily suggest themselves to such skilled persons having the benefit of this disclosure. Reference will now be made in detail to implementations of the exemplary embodiments as illustrated in the accompanying drawings. The same reference numbers will be used throughout the drawings and the following detailed description to refer to the same or like parts.

Figure 2:
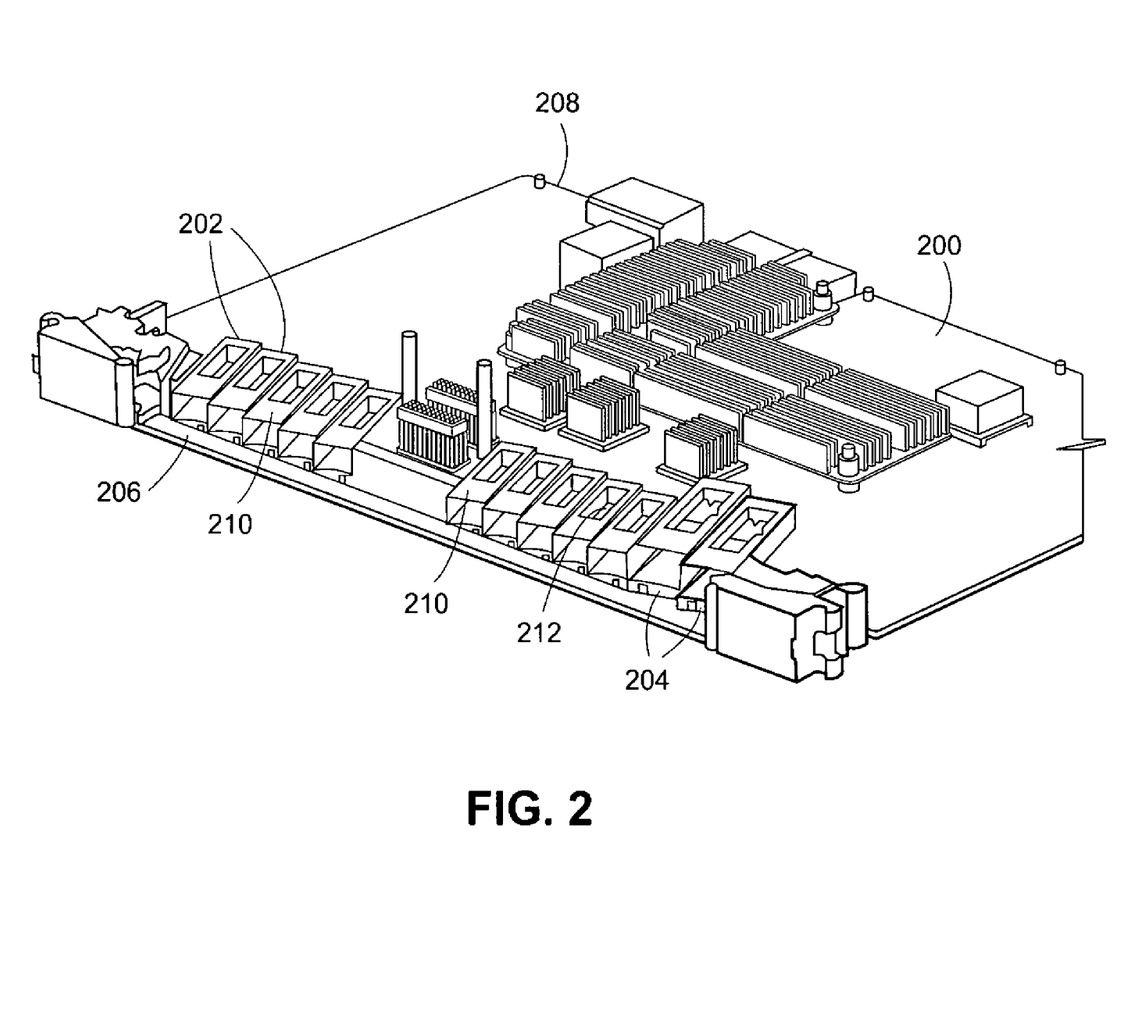
FIG. 2 shows an isometric view showing an upper part and side of a circuit board arranged in accordance with an example aspect of the present application.
Figure 5:
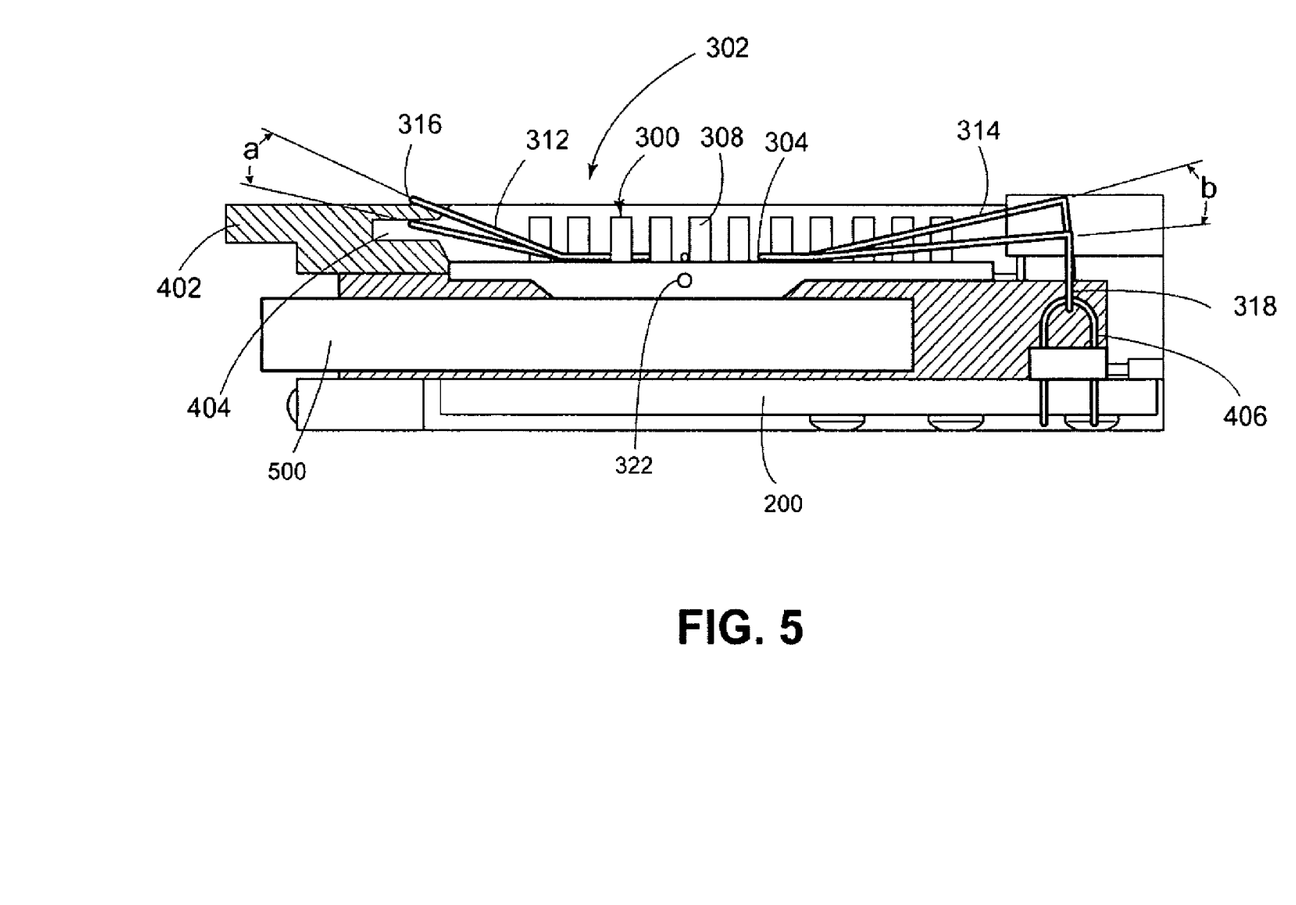
FIG. 5 shows a section view of the circuit hoard and heat sink assembly, taken along section FIG. 5-FIG. 5 shown in FIG. 4.

FIG. 2 shows a circuit board 200 having a plurality of SFP cages 202 and XFP cages 204 arranged along a front edge 206 of the circuit board 200. In the specific example illustrated, the circuit board 200 has ten SFP cages 202 and two XFP cages 204. Each of the cages 202, 204 is open along the front edge 206 of the circuit board 200 in order to receive a module 500 (FIG. 5). Each of the cages 202, 204 extends diagonally with respect to the front edge 206 toward a rear edge 208 of the circuit board 200. While the cages 202, 204 are shown extending diagonally, in other embodiments the cages 202, 204 can extend at other angles such as perpendicular with the front edge 206 of the circuit board 200, or at other orientations. Each of the cages 202, 204 has an upper surface 210, which is constructed to contact a heat sink 300 (FIG. 3A), to be discussed below. The upper surface 210 has at least one opening 212. In the embodiment shown in FIG. 2, the cages 202, 204 include one rectangular opening 212, which is constructed to align with and receive a portion of the heat sink 300. The cages 202, 204 shown in FIG. 2 are arranged so that there is substantially no (or minimal) gap between adjacent cages 202, 204.

Figures 3A, 3C:
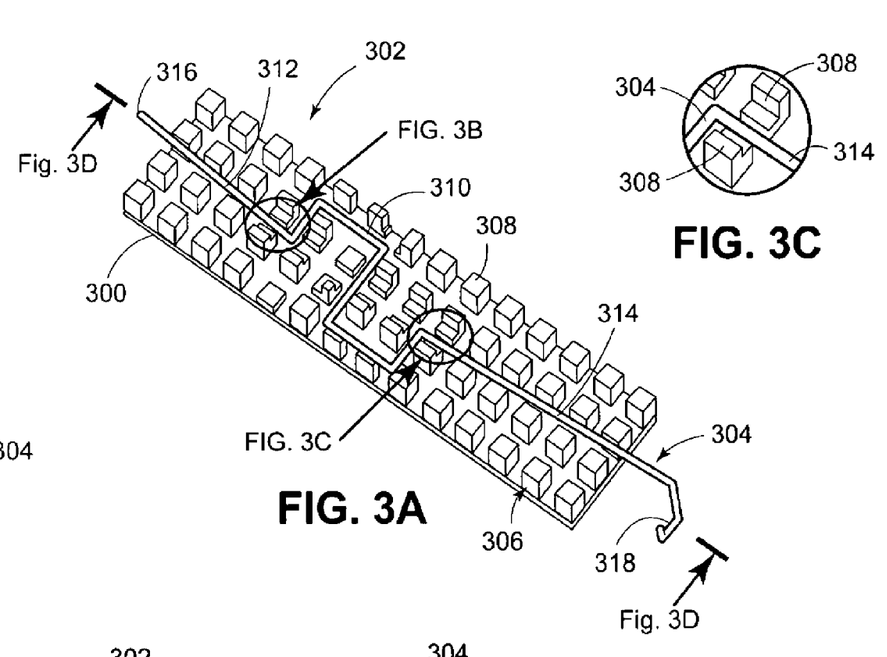
FIG. 3A shows an isometric view showing an upper part and a side of a heat sink assembly constructed in accordance with an example aspect of the present application.
FIG. 3C shows an exploded view of another portion of the heat sink assembly shown in FIG. 3A.

FIG. 3A shows a view of an upper side of a heat sink assembly 302 that includes heat sink 300 and a spring clip 304. The heat sink 300 includes a base 306 and a plurality of fins 308 extending upwardly in FIG. 3A from the base 306. As would be appreciated by those of skill in the art in view hereof, the fins 308 are arranged to conduct heat away from the base 306 and dissipate heat by convection.

Figure 3B:
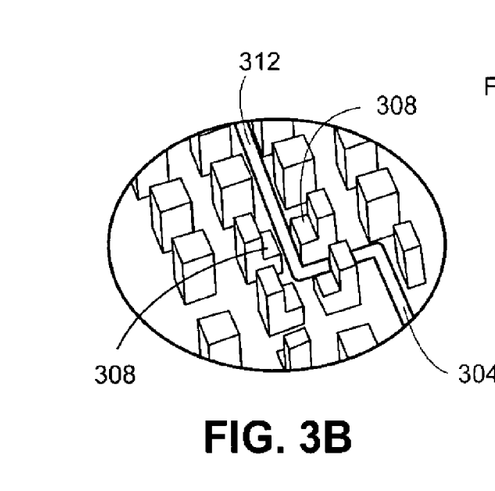
FIG. 3B shows an exploded view of a portion of the heat sink assembly shown in FIG. 3A.

The spring clip 304 has a central serpentine portion 310, a first tab 312 extending from the serpentine portion 310, and a second tab 314 extending from the serpentine portion 310. The spring clip 304 is fixed to the heat sink 300 between some of the fins 308 by snap fit connection. As shown in FIGS. 3B and 3C, at two locations on the heat sink 300, opposite ends of the serpentine portion 310 are respectively snap fit between adjacent fins 308 of the heat sink 300.

Figure 3D:
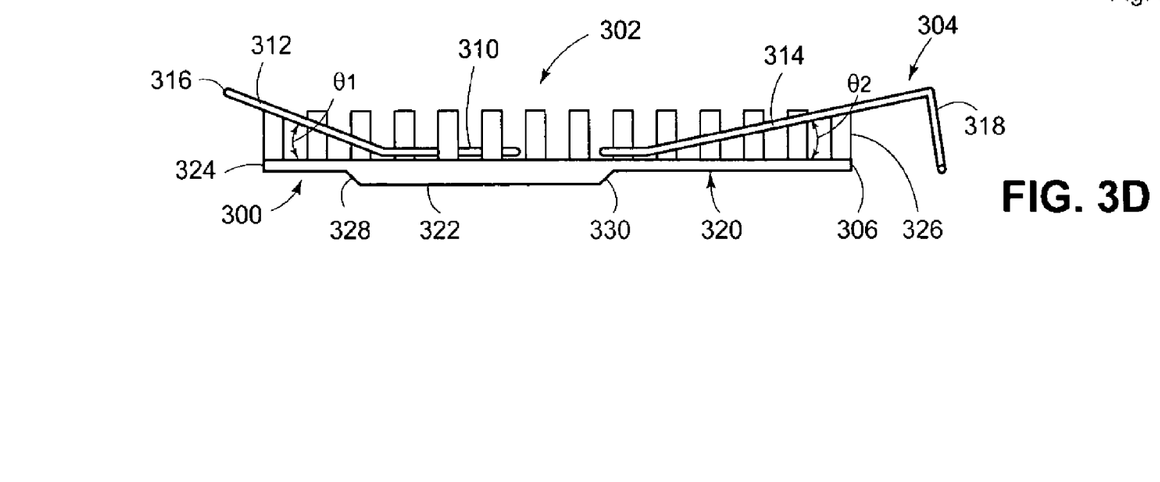
FIG. 3D shows a section view of the heat sink assembly, taken along section FIG. 3D-FIG. 3D shown in FIG. 3A.

As shown in FIG. 3D, the serpentine portion 310 of the spring clip 304 extends in a plane substantially parallel to the upper surface of the base 306 of the heat sink 300. In an uncompressed state shown in FIG. 3D, the first tab 312 extends at a first angle $\theta_1$ with respect to the upper surface of the base 306. The first tab 312 extends from the serpentine portion 310 to a first free end 316. Also, in an initial, uncompressed state shown in FIG. 3D, the second tab 314 extends at a second angle $\theta_2$ with respect to the upper surface of the base 306. The second tab 314 extends from the serpentine portion 310 to a second free end 318 which is formed as a u-shaped hook (FIG. 3A).

Also, as shown in FIG. 3D, a lower side 320 of the base 306 has a raised section 322 surrounded by a rectangular bezel (not shown). A front edge 328 and a rear edge 330 of the raised section 322 are beveled.

The heat sink 300 is generally formed from a metal, such as aluminum. The spring clip 304 is generally formed from a metal, such as steel, and is resilient so that the first and second tabs 312 and 314 can be compressed downward toward the base 306 of heat sink 300 without any permanent deformation of the spring clip 304. The arrangement of the spring clip 304 facilitates uniformly transmitting the spring force to the heat sink 300 so that suitable contact pressure is applied between the heat sink 300 and a respective cage 202, 204 when a module 500 (FIG. 5) is not inserted in the cage 202, 204 and between the heat sink 300 and the module 500 when the module 500 is inserted in the cage.

Figure 4:
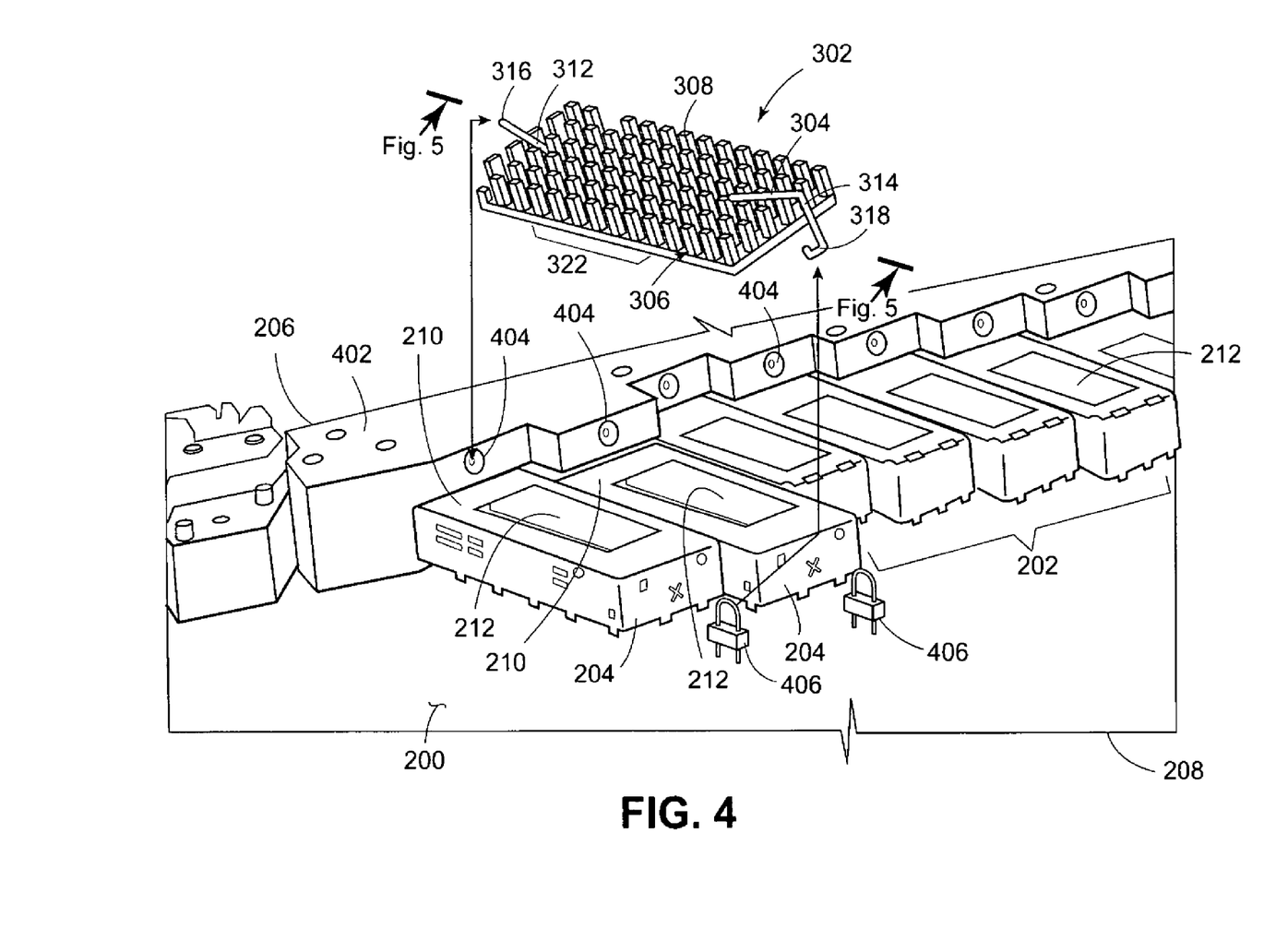
FIG. 4 is an assembly drawing showing a portion of a circuit board constructed in accordance with an example aspect herein, and the heat sink assembly shown in FIG. 3A.

Circuit board 200 is shown in FIG. 4 with a front retaining member 402 that extends across the front edge 206 of circuit board 200. Above (and offset from) each cage 202, 204 a corresponding hole 404 is formed in the retaining member 402 of circuit board 200. Each hole 404 in the retaining member 402 is constructed to receive and retain the first free end 316 of the first tab 312 of the spring clip 304. Rearward of each cage 202, 204 is a corresponding anchor 406 that is soldered on the circuit board 200. In the example embodiment shown in FIG. 4, each anchor 406 extends upwardly from the circuit board 200 and is a u-shaped latch to latch onto the second free end 318 of the second tab 314. Thus, in the example embodiment shown in FIG. 4, for each cage 202, 204 there is at least one corresponding hole 404 in the front retaining member 402 and at least one corresponding anchor 406 in the board 200.

The heat sink assembly 302 is assembled onto the board 200 as follows, in one example embodiment. The heat sink assembly 302 is oriented over a corresponding one of the cages 202, 204 so that the first tab 316 extends toward the front edge 206 of the board 200 and the second tab 314 extends toward the rear edge 208 of the board 200. The first end 316 of the first tab 312 is inserted into a hole 404 in the front retaining member 402 and the raised portion 322 of the heat sink 300 is inserted into the rectangular opening 212 in the cage 202, 204 corresponding to the hole 404 in which the first end 316 was inserted. The second tab 314 is compressed toward anchor 406 corresponding to the cage 202/204 until the second free end 318 latches onto the anchor 406.

As shown in FIG. 5, the cages 202, 204 are constructed to receive a module 500, which includes electrical and optical modules. When the heat sink assembly 302 is attached to the circuit board 200 and no module 500 is present in a corresponding one of cages 202, 204, the spring clip 304 of the heat sink assembly 302 is compressed an initial amount so as to force the bezel of heat sink 300 downwardly to contact the surface 210 of cage 202, 204 in a seated position. When the heat sink 300 is seated, the raised section 322 of heat sink 300 extends through a respective opening 212 in the corresponding cage 202, 204. Thus, when the module 500 is not present in the cage, the raised section 322 extends slightly into cage 202, 204.

When the module 500 is first introduced into a respective cage 202, 204 (as shown in FIG. 5), there will be interference between the module 500 and the raised section 322 extending into the respective cage 202, 204. Owing to the beveled front edge 328 of the raised section 322, which acts as a guide surface, when module 500 is first inserted into the respective cage 202, 204 on which heat sink 300 is seated, module 500 contacts the front edge 328 and displaces the raised section 322 upwardly. As raised section 322 is displaced upwardly, the spring clip 304 is further compressed beyond its initial compression before module 500 was inserted in the cage 202, 204. The spring force exerted by the spring clip 304 urges the raised section 322 to contact the module 500 with suitable pressure to promote conductive heat transfer from the module 500 to the heat sink 300.

The dimensions and positions of the first tab 312 and second tab 314 are such that the torque (Mo(Fa)) exerted on the spring clip 304 by the first tab 312 about point "o" is almost equal and opposite to the torque (Mo(Fb)) exerted on the spring clip 304 by the second tab 314 about point "o", when the first end 316 is in hole 404 and the second end 318 is latched to anchor 406. The substantially equal and opposite torques Mo(Fa) and Mo(Fb) permit suitable and even pressure to be applied between raised portion 322 of heat sink 300 and module 500 to enable heat transfer from module 500 to heat sink 300, which is then convected to air through fins 308.

The beveled front edge 328 and rear edge 330 shown in FIG. 3D facilitate placement of the heat sink 300 on a respective one of the cages 202, 204 and facilitate self-seating of the heat sink 300 should the heat sink assembly 302 be displaced at least partially from opening 212, such as when module 500 is first inserted into a respective cage 202, 204.

Also, the raised section 322 is located closer to a front end 324 of the heat sink 300 than it is to a rear end 326 of the heat sink 300. The off-center raised section 322 further facilitates positioning and alignment of the heat sink assembly 302 with respect to a respective one of cages 202, 204 by providing a visual indication that the heat sink assembly 302 is oriented properly or improperly with the first tab 312 extending toward the front edge 206 of the circuit board 200 and the second tab 314 extending toward the rear edge 208 of the circuit board 200, as is shown in FIG. 4. As but one example of a visual indicator that the heat sink assembly 302 may be improperly oriented, if the raised section 322 is inserted into an opening 212, and the bezel surrounding the raised section 322 is seated on upper surface 210 of a cage 202, 204, and the heat sink assembly 302 is oriented such that the second tab 314 extends towards front edge 206 of circuit board 200 instead of towards the rear edge 208 of circuit board, then the second end 318 will not be positioned relative to the circuit board 200 in a manner to enable it to be attached to the circuit board 200, as described in detail above.

Figure 6:
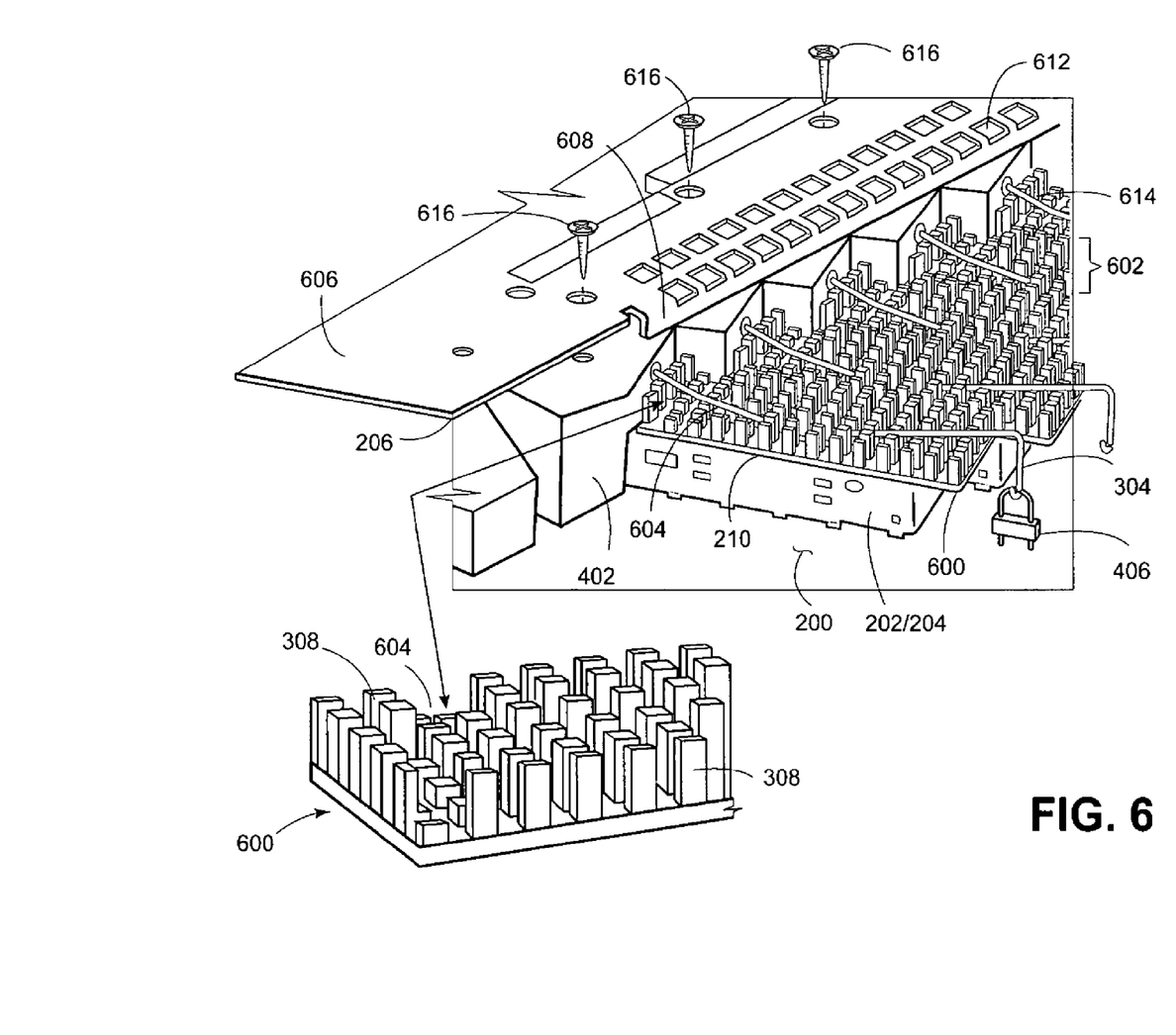
FIG. 6 is an assembly drawing of another heat sink arrangement in accordance with an example aspect herein.

FIG. 6 shows an alternative example embodiment of a heat sink arrangement of a plurality of heat sink assemblies 602 assembled onto the circuit board 200. The heat sink assemblies 602 are the same as heat sink assemblies 302, except that the heat sink 600 included with each heat sink assembly 602 is different than the heat sink 300 included with each heat sink assembly 302. In particular, in the embodiment shown in FIG. 6, a retention slot 604 is formed in each heat sink 600 to receive a wall 608 of a metal cover 606. At least one ventilation opening 612 is formed in the cover 606. The heat sink assemblies 602 are fixed to the circuit board 200 in the same way as they are for the heat sink assemblies 302 described above. When the heat sink assemblies 602 are fixed to the circuit board 200, the retention slots 604 of the heat sinks 600 align in a substantially straight line 614, which is shown being substantially parallel to the front edge 206 of the circuit board 200. Once the heat sink assemblies 602 are fixed to the circuit board 200, the wall 608 of the cover 606 is inserted into the aligned retention slot 604 and the cover 606 is secured to the retaining member 402 with screw fasteners 616.

The metal cover 606 is removably attached to the retaining member 402 with screw fasteners 616. As shown in FIG. 6, the cover 606 is not attached to retaining member 402, but is disposed slightly above retaining member 402. The cover 606 can be removed to permit the heat sink assemblies 602 to be installed and removed. When the cover 606 is attached to retaining member 402 with the wall 608 disposed in retention slots 604, the wall 608 limits movement of each heat sink 600 in a front-to-back, longitudinal direction along the upper surface 210 of its corresponding cage 202, 204, as well as limits movement in an up-and-down direction. Thus, displacement of the heat sink assemblies 602 caused by, for example, inserting and removing a module 500 (FIG. 5) from a respective cage 202, 204, can be limited.

The example embodiments described herein provide for a heat sink attachment to cage such as a transceiver cage (e.g., an SFP/XFP cage) that is space-efficient so that extra spaces need not be provided on a circuit board between adjacent cages for attachment of a heat sink to the cages. Accordingly, the example embodiments described herein permit a higher density of cages on a circuit board than do conventional arrangements.

While particular example embodiments have been shown and described, it will be obvious to those of skills in the art that based upon the teachings herein, changes and modifications may be made to the example embodiments without departing from these embodiments and their broader aspects. Therefore, the appended claims are intended to encompass within their scope all such changes and modifications as are within the true spirit and scope of the exemplary embodiments.

The invention claimed is:

1. A heat sink assembly including:
   a heat sink having a base and fins extending from the base; and
   a spring clip disposed on the heat sink between the fins, the spring clip including (a) a first tab that forms a first angle with respect to the base of the heat sink, (b) a second tab that forms a second angle with respect to the base of the heat sink, and (c) a serpentine portion, interposed between the first tab and the second tab, and extending in its entirety in a plane that is substantially parallel to an upper surface of the base of the heat sink, wherein the first tab and the second tab are respectively compressible in a direction toward the base of the heat sink.

2. The heat sink assembly according to claim 1, wherein the heat sink includes a raised portion extending from a lower side of the base that is opposite from an upper side of the base from which the fins extend.

3. The heat sink assembly according to claim 2, wherein the raised portion is off-center along the lower side of the base.

4. The heat sink assembly according to claim 2, wherein the raised portion has a beveled front edge and a beveled rear edge.

5. The heat sink assembly according to claim 2, wherein the raised portion is surrounded by a bezel.

6. The heat sink assembly according to claim 1, wherein the spring clip is constructed to be compressed by deflecting the first tab by a first angular amount and by deflecting the second tab by a second angular amount such that a first torque exerted on the first tab and a second torque exerted on the second tab are substantially equal and opposite.

7. The heat sink assembly according to claim 1, wherein the heat sink assembly is mountable on a cage, and
   wherein the cage includes one of an SFP and an XFP cage.

8. The heat sink assembly according to claim 1, wherein the heat sink has a retention slot formed between at least some of the fins which is constructed to receive at least a portion of a cover fixed to a circuit board.

9. A heat sink attachment system comprised of:
   a circuit board having one or more cages mounted thereto, each cage having an upper surface formed with an opening therethrough; and
   a heat sink assembly mountable on at least a respective one of the cages, the heat sink assembly including:
   a heat sink having a base and fins extending from the base, and
   a spring clip disposed on the heat sink between the fins, the spring clip including (a) a first tab that forms a first angle with respect to the base of the heat sink, (b) a second tab that forms a second angle with respect to the base of the heat sink, and (c) a serpentine portion, interposed between the first tab and the second tab, and extending in its entirety in a plane that is substantially parallel to an upper surface of the base of the heat sink, wherein the first tab and the second tab are respectively compressible in a direction toward the base of the heat sink.

10. The heat sink attachment system according to claim 9, wherein the circuit board includes a retaining member extending across a front edge of the circuit board, the retaining member retaining the first tab in a compressed state when the heat sink assembly is mounted on at least the respective one of the cages.

11. The heat sink attachment system according to claim 9, wherein the circuit board includes an anchor constructed to retain the second tab in a compressed state when the heat sink assembly is mounted on the respective one of the cages.

12. The heat sink attachment system according to claim 9, further comprising a cover having a wall insertable in a retention slot formed between at least some of the fins of the heat sink to limit movement of the heat sink with respect to the cage.

13. The heat sink attachment system according to claim 12, wherein the cover has one or more ventilation openings formed therein.

14. The heat sink attachment system according to claim 10, wherein the spring clip is constructed to be compressed by deflecting the first tab by a first angular amount and by deflecting the second tab by a second angular amount such that a first torque exerted on the first tab and a second torque exerted on the second tab are substantially equal and opposite.

15. The heat sink attachment system according to claim 14, wherein the spring clip is constructed to force the heat sink into a seated position in an opening of a respective one of the cages when a module is not present in the cage and to force the heat sink into contact with the module when the module is present in the cage.

16. The heat sink attachment system according to claim 15, wherein when the heat sink is in a seated position, at least one portion of the heat sink extends through the opening of the cage and into the cage.

17. A procedure for mounting a heat sink, the procedure comprising:
    placing a heat sink assembly on a cage of a circuit board, the heat sink assembly including a heat sink having a base and fins extending from the base, and a spring clip disposed on the heat sink between the fins, the spring clip including (a) a first tab that forms a first angle with respect to the base of the heat sink, (b) a second tab that forms a second angle with respect to the base of the heat sink, and (c) a serpentine portion, interposed between the first tab and the second tab, and extending in its entirety in a plane that is substantially parallel to an upper surface of the base of the heat sink, wherein the first tab and the second tab are respectively compressible in a direction toward the base of the heat sink; and
    securing the first tab and the second tab to the circuit board.

18. The procedure according to claim 17, further comprising:
    inserting a cover into a retention slot formed between at least some of the fins of heat sink; and
    coupling the cover to the circuit board.

* * * * *